United States Patent
Yamada et al.

(10) Patent No.: US 10,276,475 B2
(45) Date of Patent: Apr. 30, 2019

(54) THERMAL CONDUCTIVE STRESS RELAXATION STRUCTURE

(71) Applicant: KABUSHIKI KAISHA TOYOTA CHUO KENKYUSHO, Nagakute-shi, Aichi-ken (JP)

(72) Inventors: Yuka Yamada, Toyota (JP); Hiroshi Hohjo, Nagoya (JP); Hidehiko Kimura, Nagoya (JP); Atsushi Kawamoto, Nagakute (JP); Tadayoshi Matsumori, Nagakute (JP); Tsuguo Kondoh, Chiryu (JP); Hiroshi Osada, Komaki (JP); Masanori Usui, Seto (JP)

(73) Assignee: KABUSHIKI KAISHA TOYOTA CHUO KENKYUSHO, Nagakute (JP)

(*) Notice: Subject to any disclaimer, the term of this patent is extended or adjusted under 35 U.S.C. 154(b) by 1531 days.

(21) Appl. No.: 14/136,234

(22) Filed: Dec. 20, 2013

(65) Prior Publication Data

US 2014/0174706 A1   Jun. 26, 2014

(30) Foreign Application Priority Data

Dec. 26, 2012 (JP) .................................. 2012-282349
Dec. 11, 2013 (JP) .................................. 2013-256237

(51) Int. Cl.
*F28F 7/00* (2006.01)
*H01L 23/373* (2006.01)
(Continued)

(52) U.S. Cl.
CPC ............ *H01L 23/373* (2013.01); *F28F 21/02* (2013.01); *F28F 21/08* (2013.01); *H01L 23/36* (2013.01);
(Continued)

(58) Field of Classification Search
CPC ................. H01L 23/373; H01L 23/40; H01L 2023/4037; F28D 2020/0091;
(Continued)

(56) References Cited

U.S. PATENT DOCUMENTS 5,170,329 A * 12/1992 Purdes ................ H01L 23/3732
257/E23.083
6,649,265 B1 * 11/2003 Kawamura ............ C04B 41/009
257/E23.006
(Continued)

FOREIGN PATENT DOCUMENTS

JP S63-313843 A 12/1988
JP H08-186203 A 7/1996
(Continued)

OTHER PUBLICATIONS

May 31, 2016 Office Action issued in Japanese Patent Application No. 2013-256237.

*Primary Examiner* — Keith M Raymond
*Assistant Examiner* — Kamran Tavakoldavani
(74) *Attorney, Agent, or Firm* — Oliff PLC

(57) ABSTRACT

A thermal conductive stress relaxation structure is interposed between a high-temperature substance and a low-temperature substance to conduct heat in a heat-transfer direction from the high-temperature substance to the low-temperature substance. The structure includes an assembly configured such that a thermal conductive material gathers in a non-bonded state having stress relaxation effect. Such an assembly is a rolled-up body configured such that a carbon-based sheet material and a metal-based sheet material are alternately rolled up, for example. This structure has one or more interfaces at which adjacent parts can slide, thereby dividing a deformable region to relax the thermal stress. It has a low rigidity and can thus deform to release the thermal stress. The structure can suppress the thermal stresses and
(Continued)

the shape changes that would be generated in the high-temperature substance and the low-temperature substance, and each physical body located there between.

14 Claims, 13 Drawing Sheets

(51) Int. Cl.
  *F28F 21/02* (2006.01)
  *F28F 21/08* (2006.01)
  *H01L 23/36* (2006.01)
  *F28F 13/00* (2006.01)
  *F21V 29/00* (2015.01)
  *F21V 29/85* (2015.01)
  *F21Y 115/10* (2016.01)

(52) U.S. Cl.
  CPC .............. *F21V 29/20* (2013.01); *F21V 29/85* (2015.01); *F21Y 2115/10* (2016.08); *F28F 2013/005* (2013.01); *F28F 2255/06* (2013.01); *F28F 2265/26* (2013.01); *H01L 2924/0002* (2013.01); *Y10T 29/4935* (2015.01)

(58) Field of Classification Search
  CPC . F28D 9/0087; F28F 2255/02; F28F 2265/14; F28F 21/02; F28F 2013/006; F28F 2013/005; F28F 2013/008
  See application file for complete search history.

(56) References Cited

U.S. PATENT DOCUMENTS

| | | | | |
|---|---|---|---|---|
| 8,188,512 | B2* | 5/2012 | Kim | C30B 25/10 117/88 |
| 8,287,975 | B2* | 10/2012 | Ohta | B32B 27/00 165/185 |
| 2003/0096059 | A1* | 5/2003 | Suzuki | C25D 5/022 427/282 |
| 2007/0062676 | A1* | 3/2007 | Yao | H01L 23/3675 165/104.33 |
| 2009/0200065 | A1* | 8/2009 | Otoshi | H01L 23/367 174/252 |
| 2010/0002399 | A1* | 1/2010 | Mori | H01L 23/3735 361/719 |
| 2010/0321895 | A1* | 12/2010 | Hill | H05K 7/20472 361/715 |
| 2011/0197987 | A1* | 8/2011 | Koravos | F16L 59/026 138/149 |
| 2012/0098134 | A1* | 4/2012 | Okamoto | B32B 15/017 257/765 |

FOREIGN PATENT DOCUMENTS

| | | |
|---|---|---|
| JP | A-10-168502 | 6/1998 |
| JP | 2001-144237 A | 5/2001 |
| JP | B2-3673436 | 7/2005 |
| JP | B2-4380774 | 12/2009 |
| JP | B2-4431679 | 3/2010 |
| JP | B2-4621531 | 1/2011 |
| JP | B2-4711165 | 6/2011 |
| JP | B2-4957208 | 6/2012 |
| JP | 2012-141093 A | 7/2012 |
| WO | 2011/008467 A1 | 1/2011 |

* cited by examiner

2mm

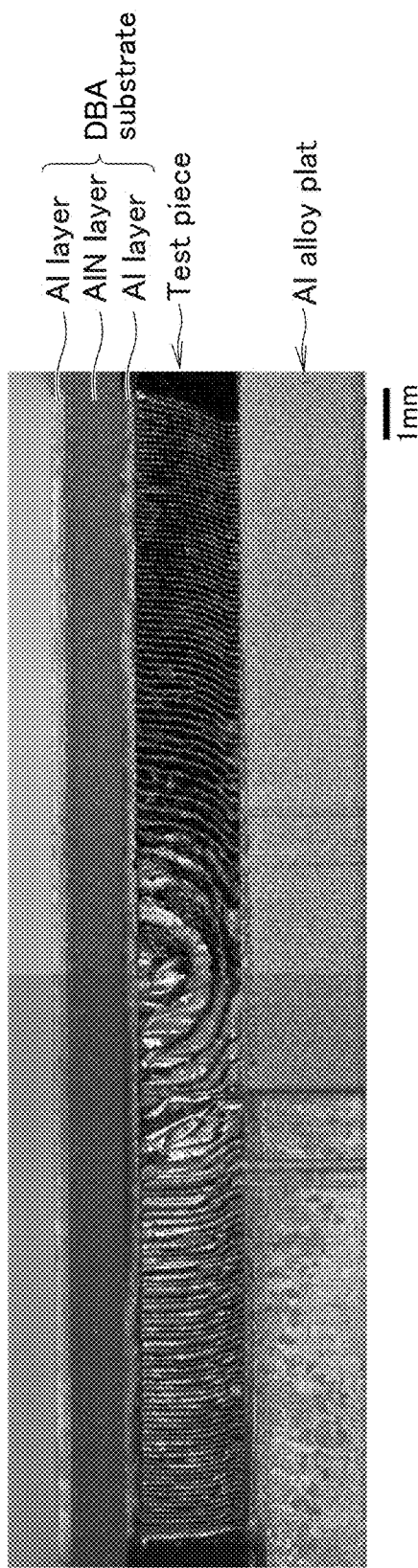

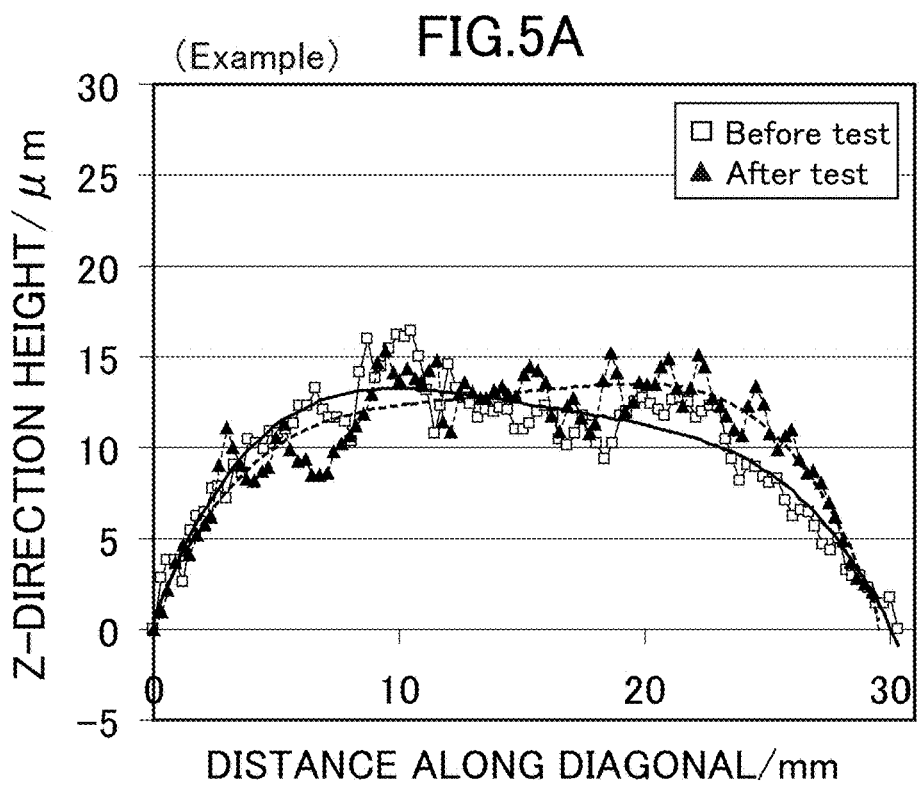
FIG.5A (Example)
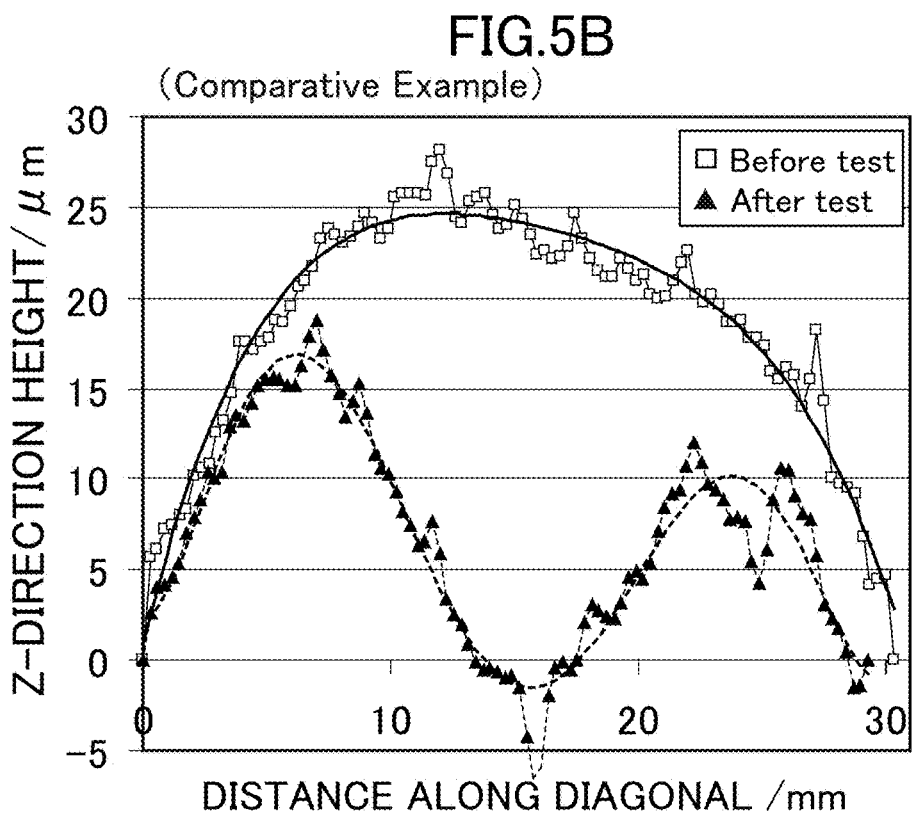
FIG.5B (Comparative Example)

THERMAL CONDUCTIVE STRESS RELAXATION STRUCTURE

TECHNICAL FIELD

The present invention relates to a thermal conductive stress relaxation structure that has enhanced thermal conductivity from a high-temperature substance to a low-temperature substance and enhanced relaxation ability for a thermal stress.

BACKGROUND ART

Various devices and machines generate heat, such as chemical heat generation due to burning and reaction etc. and electrical heat generation (Joule heat generation) caused by current flow in a circuit. In order for such devices and machines to be stably operated, efficient thermal conduction may be required from the high-temperature side to the low-temperature side without heat accumulation. In addition, a thermal stress is generated depending on the temperature difference (or temperature gradient) and the difference in coefficient of expansion among respective physical bodies that constitute such devices and machines (e.g., a high-temperature substance and a low-temperature substance, and each physical body located therebetween). To enhance the durability and reliability of devices and machines, such a thermal stress may also have to be reduced or relaxed among them (e.g., a high-temperature substance and a low-temperature substance, and each physical body located therebetween).

To this end, a thermal conductive stress relaxation structure can be interposed between the high-temperature substance and the low-temperature substance so as to be able to satisfy both the thermal conductivity and the thermal stress relaxation ability. Descriptions relevant to such a thermal conductive stress relaxation structure are disclosed in each Patent Literature (PTL) below, for example.

CITATION LIST

Patent Literature

[PTL 1]
JP Patent No. 4711165
[PTL 2]
JP Patent No. 4431679
[PTL 3]
JP Patent No. 3673436
[PTL 4]
Japanese Unexamined Patent Application Publication No. 10-168502
[PLT 5]
JP Patent No. 4621531
[PLT 6]
JP Patent No. 4957208
[PLT 7]
JP Patent No. 4380774

SUMMARY OF INVENTION

Technical Problem

PTLs 1 to 4 involve descriptions relevant to a composite material configured such that a carbon material and a metal material are integrated with each other. A structure comprising such a composite material basically has higher thermal conductivity and lower thermal expansion than those of a structure that consists only of a metal material, and is thus capable of satisfying both the thermal conductivity and the thermal stress relaxation ability.

PTLs 5 to 7 involve descriptions relevant to a power module having: an insulating substrate on which semiconductor elements such as IGBTs as heat generation sources are placed; a cooler that absorbs and releases heat generated in the semiconductor elements via the insulating substrate; and a stress relaxation member interposed between the insulating substrate and the cooler. In particular, PTL 5 and PTL 6 each propose a stress relaxation member made of metal, in which through holes and/or slits are provided to achieve low rigidity. PTL 7 proposes a stress relaxation member that comprises a powder compact of metal powder and resin binder. In such stress relaxation members, thermal conduction between the insulating substrate and the cooler is carried out by a metal portion, and deformation of the metal portion is made easy thereby to relax the thermal stresses in the semiconductor elements and/or the insulating substrate.

It should be noted, however, that the above-described composite material has poor wettability between the carbon material and the metal. This may require the materials to be combined such as by sintering and impregnation with pressurizing and heating, thus making difficult the production. In addition, the composite material of aluminum and carbon material may not be a good thermal conductive material because some low thermal conductive and deliquescent carbide may be formed due to the electric discharge sintering and/or impregnation. Moreover, such composite materials are intended to achieve the thermal stress relaxation by having a lower coefficient of thermal expansion than that of a single metal substance, but sufficient effects have not been obtained. Furthermore, the above-described stress relaxation member is provided therein with through holes, slits and/or resin parts in order to achieve the thermal stress relaxation, but the thermal conductivity deteriorates accordingly. Therefore, such a stress relaxation member is insufficient in satisfying both the thermal conductivity and the thermal stress relaxation ability.

The present invention has been created in view of such circumstances, and an object of the present invention is to provide a structure having a novel configuration that makes relatively easy the production and can satisfy both the thermal conductivity and the thermal stress relaxation ability.

Solution to Problem

As a result of intensive studies to solve such problems and repeating trial and error, the present inventors have conceived of locating, between a high-temperature substance and a low-temperature substance, a rolled-up body configured such that a thin graphite sheet and an aluminum foil are rolled up, thereby to satisfy both the thermal conductivity therebetween and the relaxation ability for the thermal stress that can be generated therebetween. Developing and generalizing this original idea, the present invention has been accomplished as will be described hereinafter.

《 Thermal Conductive Stress Relaxation Structure》

(1) According to an aspect of the present invention, there is provided a thermal conductive stress relaxation structure to be located or interposed between a high-temperature substance and a low-temperature substance. The thermal conductive stress relaxation structure conducts heat in a heat-transfer direction from the high-temperature substance to the low-temperature substance, and relaxes a thermal stress that can be generated between the high-temperature substance and the low-temperature substance. The thermal conductive stress relaxation structure has a feature that it comprises an assembly configured such that a thermal conductive material gathers in a non-bonded state.

(2) First, the thermal conductive stress relaxation structure according to the present invention (which may simply be referred to as "the structure") comprises an assembly configured such that a thermal conductive material gathers in a non-bonded state, and hence, if the structure is interposed between a high-temperature substance and a low-temperature substance, then the thermal conductive material allows efficient thermal conduction from the high-temperature substance to the low-temperature substance. In particular, the thermal conductive material being a thermal conductive sheet that continuously extends allows high thermal conductivity to efficiently be achieves, and is thus preferable.

Meanwhile, during thermal conduction from the high-temperature substance to the low-temperature substance, if the high-temperature substance and the low-temperature substance, and each physical body and the structure according to the present invention that are located therebetween, are in a state of being constrained, then a thermal stress is generated between each respective components depending on the temperature difference and the coefficient of thermal expansions. Here, the thermal conductive stress relaxation structure (assembly) according to the present invention is configured such that the thermal conductive material gathers in a non-bonded state, and therefore has one or more interfaces at which adjacent parts can slide. This allows a deformable region to be divided into plural regions so that the constraint of each divided deformable region in the assembly becomes small, thereby to relax the thermal stress. In addition, the thermal conductive stress relaxation structure (assembly) has a lower rigidity compared with that of a bulk body, so that the structure according to the present invention deforms to release the thermal stress. These effects of thermal stress relaxation by the present structure significantly suppress the thermal stresses and the shape changes that would be generated in the high-temperature substance and the low-temperature substance, and each physical body located therebetween.

In such a way, the thermal conductive stress relaxation structure according to the present invention is provided between a high-temperature substance and a low-temperature substance thereby to ensure the thermal conduction from the high-temperature substance to the low-temperature substance and significantly reduce or relax the thermal stress that acts on the high-temperature substance or the low-temperature substance, or each member located therebetween, and improvement such as in the reliability and durability can be achieved for devices, machines and the like having heat generating sources.

It should be appreciated that the thermal conductive stress relaxation structure according to the present invention can be relatively easily produced because the structure is obtained by gathering the thermal conductive material in a non-bonded state. This also enables to provide at low cost the thermal conductive stress relaxation structure itself and a device, machine and the like that use the thermal conductive stress relaxation structures.

«Production Method for Thermal Conductive Stress Relaxation Structure»

(1) The present invention can also be understood as a production method for the above-described thermal conductive stress relaxation structure. For example, the present invention can be understood as a production method for a thermal conductive stress relaxation structure, wherein the production method comprises: an overlapping step that overlaps two or more thermal conductive sheet materials or two or more parts of one thermal conductive sheet material as the thermal conductive material on one another to obtain a multi-layer body; a rolling-up step that rolls up one or more such thermal conductive sheet materials to obtain a rolled-up body; a folding-back step that folds back one or more such thermal conductive sheet materials on themselves to obtain a folded-back body; or a bundling step that bundles two or more thermal conductive wire materials to obtain a bundled body, etc. It is preferred that the production method according to the present invention further comprises a holding step that forms a holding portion on at least a part of the outer circumference side to hold the gathering state of one or more thermal conductive materials, and/or an end portion forming step that forms a holding end portion at the high-temperature substance side or the low-temperature substance side, etc.

(2) The assembly according to the present invention may be one in which thermal conductive materials (such as thermal conductive sheet materials), or parts of one thermal conductive material, adjacent to one another in the assembling direction (such as stacking direction and rolling-up direction) in a non-bonded state, gather in a close contact state with one another, or may also be one in which they gather in a separated state such that a certain air gap (clearance) is formed in between. In the latter case, the clearance may be constant across the whole regions, or may vary by being adjusted in terms of regions with consideration for the thermal conductivity and the thermal stress relaxation ability. When the thermal conductive material or materials comprise plural types, air gaps may be present among respective thermal conductive materials in a set of the plural types, or air gaps may also be present among sets of the plural types in terms of a set of overlapped ones. For example, when the thermal conductive material comprises a metal-based thermal conductive material and a carbon-based thermal conductive material, air gaps may be formed among sets in terms of one set comprising the metal-based thermal conductive material and the carbon-based thermal conductive material in close contact with each other.

Such an assembly may be formed by adjusting the number of rolling-up and the rolling-up force etc. of the thermal conductive sheet material or materials, but the production method as below may preferably be used if the clearance between adjacent thermal conductive materials or between adjacent parts is actively adjusted or controlled. Namely, it is preferred to use a production method for a thermal conductive stress relaxation structure, characterized by comprising: a preliminarily assembling step that obtains a preliminary assembly in which a thermal conductive material, including at least a metal-based thermal conductive material, and an organic substance-based material are assembled; and a dissipating step that burns or dissolves the organic substance-based material to be dissipated from the preliminary assembly, whereby the above-described assembly is obtained.

The preliminary assembly can be provisionally formed such that one or more metal-based thermal conductive materials (e.g., metal-based sheet materials) are assembled (e.g., stacked or rolled-up) via one or more organic substance-based materials (e.g., organic substance-based sheet materials), thereby to allow the distance between adjacent metal-based thermal conductive materials to be freely adjusted or changed in accordance with the thickness and/or the number of stacked organic substance-based materials (preliminarily assembling step). Thereafter, this preliminary assembly may be heated or immersed in a solvent etc, and the organic substance-based materials can thus be selectively removed such as by means of burning or dissolving (dissipating step). In such a way, an assembly can readily be obtained in which a desired clearance is formed between adjacent metal-based thermal conductive materials. Note that one or more metal-based thermal conductive materials and one or more organic substance-based materials that constitute the preliminary assembly may be individual ones, or may preliminarily be integrated with one another (e.g., an organic substance-based material is coated on at least one of surfaces of a metal-based conductive material).

《Others》

(1) The "non-bonded state" as used in the present invention refers to a state where thermal conductive materials or parts of a thermal conductive material are not chemically or mechanically bonded or coupled and so on in a large part of the assembly except for a part to be bonded or coupled and so on at an end or ends or outer circumference of the assembly, and adjacent thermal conductive materials or adjacent parts of a thermal conductive material are thus able to slide on each other. The chemical coupling refers to a case where components react between thermal conductive materials or between parts of a thermal conductive material to mutually form solid solution or form a new product material, for example. The mechanical coupling refers to a case of actively providing irregularities for calking, for example.

(2) The high-temperature substance and the low-temperature substance as used herein are expressions for convenience to explain the thermal conductive stress relaxation structure according to the present invention. Therefore, the thermal conductive stress relaxation structure according to the present invention needs not be bonded directly to the high-temperature substance or the low-temperature substance. In addition, the high-temperature substance and the low-temperature substance may not necessarily be constitutional members of a machine or device in which the thermal conductive stress relaxation structure according to the present invention is employed. For example, the high-temperature substance and the low-temperature substance may be fluids, such as gas and liquid, which exist inside or outside the machine or the like. In other words, the thermal conductive stress relaxation structure according to the present invention may be one that is used in a situation where both the thermal conductivity and the thermal stress relaxation ability are required for at least one of the above-described high-temperature bonded side or low-temperature bonded side. Note that the temperature difference between the high-temperature substance and the low-temperature substance may be stationary or may vary.

(3) The "X-based material" as used herein refers to a material that contains a certain material (X material) or elements (X) as the main component. Suffice it to say that the main component means a case where the X material or X elements exceed 50 mass % to the total (100 mass %). In addition, the "X-based . . . material" represents various members that comprise such X-based materials.

(4) The "sheet material" as used herein widely encompasses relatively thin ones, such as sheet-like one as well as tape-like one, film-like one and other appropriate ones, and the dimensions thereof, such as the size and thickness, are not limited.

(5) Unless otherwise stated, a numerical range "x to y" as used herein includes the lower limit value x and the upper limit value y. Various numerical values or any numerical value included in numerical ranges described herein may be freely selected or extracted as a new lower limit value or upper limit value, and any numerical range such as "a to b" may thereby be newly provided using such a new lower limit or upper limit

BRIEF DESCRIPTION OF DRAWINGS

FIG. 3B is a magnified photograph of the cross-sectional surface.

FIG. 5A is a graph illustrating profiles on the outermost surface of a bonded body according to an example before and after the cooling/heating cycle test.

FIG. 5B is a graph illustrating profiles on the outermost surface of a bonded body according to a comparative example before and after the cooling/heating cycle test.

EMBODIMENTS FOR CARRYING OUT THE INVENTION

Figure 1A:
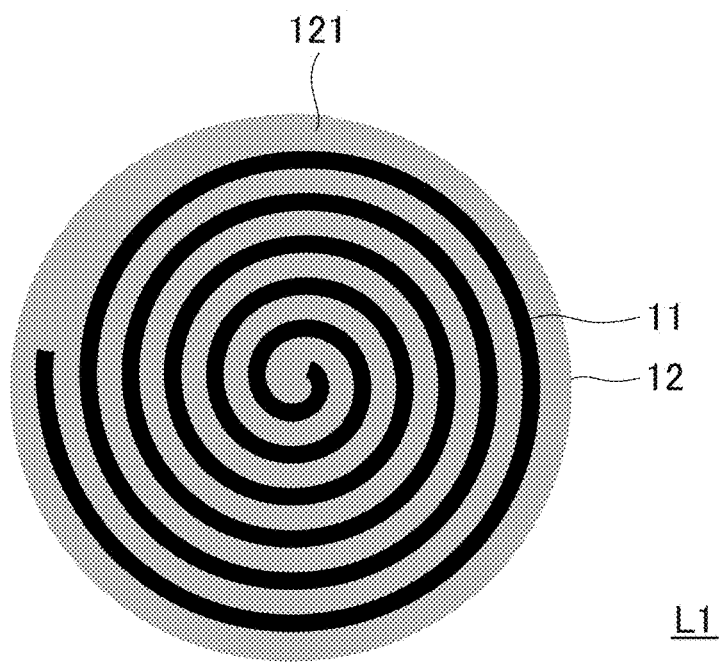
FIG. 1A is a schematic view illustrating a first embodiment of a multi-layer body that constitutes a thermal conductive stress relaxation structure.

The contents described herein may cover not only the thermal conductive stress relaxation structure according to the present invention but the production method for the same. Features regarding the production method, when understood as a product-by-process claim, may also be features regarding a product. One or more features freely selected from the description herein may be added to the above-described features of the present invention. Which embodiment is the best or not may be different in accordance with objectives, required performance and other factors.

« Thermal Conductive Material»

It is preferred that the thermal conductive material has excellent thermal conductivity in the surface direction (normal direction) and is a continuous body. The type (such as material quality and form) and the characteristics thereof are not limited. Depending on the specifications of a device, machine or the like, any thermal conductive material may appropriately be used which has suitable characteristics, such as thermal conductivity, low thermal expansion ability, rigidity, strength, and friction characteristics. One type of the thermal conductive material may be used, or two or more types of the thermal conductive materials having different material qualities and characteristics may also be used in combination. For example, a carbon-based thermal conductive material having high thermal conductivity and a metal-based thermal conductive material having excellent characteristics, such as rigidity, strength, workability and cost, may be used in combination.

The carbon-based thermal conductive material comprises, for example, black lead (graphite), carbon black, graphene, fullerene, carbon nanotube, and/or carbon fiber, etc. The metal-based thermal conductive material comprises, for example, aluminum, copper, silver, zinc, tin, iron, nickel, magnesium, titanium, tungsten, and/or molybdenum, etc. or alloy thereof. The form of the thermal conductive material may be sheet-like (including tape-like and film-like, etc.) or fiber-like, etc.

When plural types of the thermal conductive materials are used in combination, these thermal conductive materials are alternately adjacent to one another, or locating regions may be adjusted depending on the specifications and characteristics, etc. of a device, machine or the like in which the thermal conductive stress relaxation structure is used. For example, a carbon-based thermal conductive material having high thermal conductivity may be intensively located at a region that requires high thermal conductivity (e.g., central part), while a metal-based thermal conductive material having high rigidity may be intensively located at a region that requires rigidity and strength (e.g., outer circumferential part).

When adjacent thermal conductive materials are in contact with each other such as during the use of the thermal conductive stress relaxation structure, the smaller frictional force acting on the adjacent ones causes the contacting surfaces to slide more easily on each other, so that the thermal stress acting on the assembly is likely to be relaxed. In this respect, it is preferred that at least one of the adjacent thermal conductive materials has a low frictional surface that can reduce the friction coefficient during the contact. Such a thermal conductive material may be one, such as the above-described carbon-based thermal conductive material, which is a low frictional material in whole, or one configured such that a low frictional layer is formed on the surface to reduce the friction coefficient during the contact to a lower value than that of the mother material. Note that such a low frictional surface or low frictional layer may be formed as the whole surface of the thermal conduct material, or distributed within a part or parts of the surface.

« Assembly/Thermal Conductive Stress Relaxation Structure»

The assembly may take various forms by altering the gathering form and the arrangement, etc. of the thermal conductive material or materials. For example, the assembly may be a multi-layer body configured such that two or more thermal conductive sheet materials, or two or more parts of one thermal conductive sheet material, overlap one another to extend continuously in the heat-transfer direction. This multi-layer body may be a rolled-up body configured such that one or more thermal conductive sheet materials are rolled up in a non-bonded state, or a stacked body configured such that two or more thermal conductive sheet materials are stacked on one another in a non-bonded state, or a folded-back body configured such that one or more thermal conductive sheet materials are switched back, i.e., folded back on themselves, in a non-bonded state. Further, the multi-layer body may be a set of multi-layer bodies configured such that a plurality of one or more types of those rolled-up body, stacked body and folded-back body, etc. are combined. Various embodiments thereof are shown in FIG. 1A to FIG. 1K and FIG. 1M. Unless otherwise stated, in any case of presenting a cross-sectional view or a plan view, the direction perpendicular to the plane of paper is the heat-transfer direction, and the thermal conductive sheet materials extend in this direction. In this case, the rolling-up direction, the stacking direction or the folding-back direction is a direction substantially perpendicular to the heat-transfer direction (extending direction of the thermal conductive materials).

FIG. 1A illustrates a rolled-up body L1 as one embodiment of the multi-layer body. The rolled-up body L1 is an assembly configured such that a carbon-based sheet material 11 (black-colored area) and a metal-based sheet material 12 (gray-colored area) are rolled up into a cylindrical form (spiral or convolute form) in a non-bonded state. Note that the outer circumferential side end portion of the metal-based sheet material 12 is formed with a combined portion 121 that is bonded such as by laser welding and extends in the longitudinal direction (lateral line direction). This combined portion 121 holds the rolled-up state of each sheet material (gathering state of the thermal conductive materials). It is thus preferred that the thermal conductive stress relaxation structure according to the present invention has a holding portion on at least a part of the outer circumference side to hold the gathering state of the thermal conductive materials.

In an alternative embodiment, the thermal conductive stress relaxation structure according to the present invention may be a board-like multi-layer body (e.g., disk-like rolled-up body) obtained such as by wire-cutting a column-like multi-layer body as described above (e.g., cylindrical rolled-up body L1) into those having a certain width (thickness). In addition, the cylindrical shape may be processed into a rectangular column shape depending on the shapes of upper and lower physical bodies. This applies to other multi-layer bodies as will be described below. In a further embodiment where the low-temperature substance is larger than the high-temperature substance, it is preferred that the structure has a conical shape.

Figure 1B:
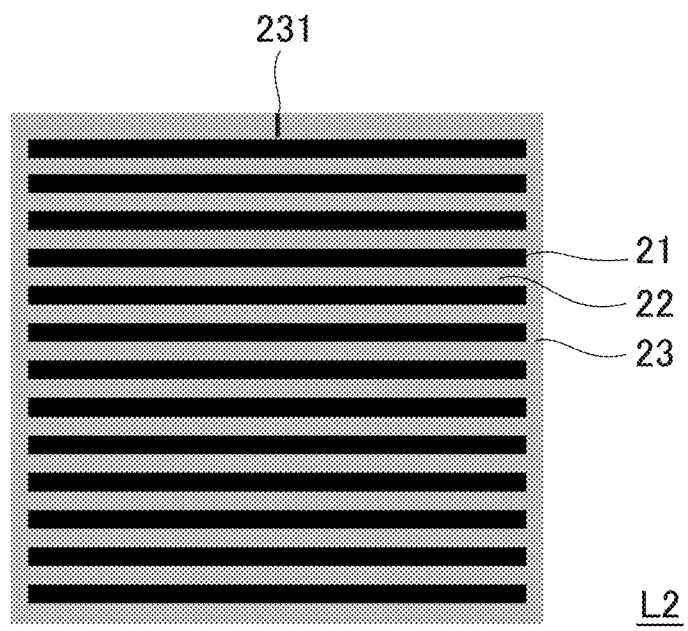
FIG. 1B is a schematic view illustrating a second embodiment of a multi-layer body.

FIG. 1B illustrates a stacked body L2 as one embodiment of the multi-layer body. The stacked body L2 is an assembly configured such that carbon-based sheet materials 21 (black-colored areas) and metal-based sheet materials 22 (gray-colored areas) are stacked in one direction in a non-bonded state. The outer circumferential side end portions of the metal-based sheet materials 22 are surrounded by a metal-based sheet material 23 that has the same material quality as those of the metal-based sheet materials 22. In addition, both end portions of the metal-based sheet material 23 that extend in the longitudinal direction (perpendicular direction to the plane of paper) are bonded such as by laser welding to form a combined portion 231 (holding portion).

Note that the heat-transfer direction of the stacked body L2 can be set in any direction on the plane of paper, other than the above-described direction perpendicular to the plane of paper, depending on the actual heat-transfer direction. However, the longitudinal direction (up-down direction) on the plane of paper may not be preferable as the heat-transfer direction. The heat transfer in this direction requires the repetition of local heat transfer between each carbon-based sheet material 21 and each metal-based sheet material 22 to increase the total heat resistance, so that the thermal conductivity as the whole of the assembly, and therefore as the whole of the thermal conductive stress relaxation structure, may deteriorate.

Figure 1C:
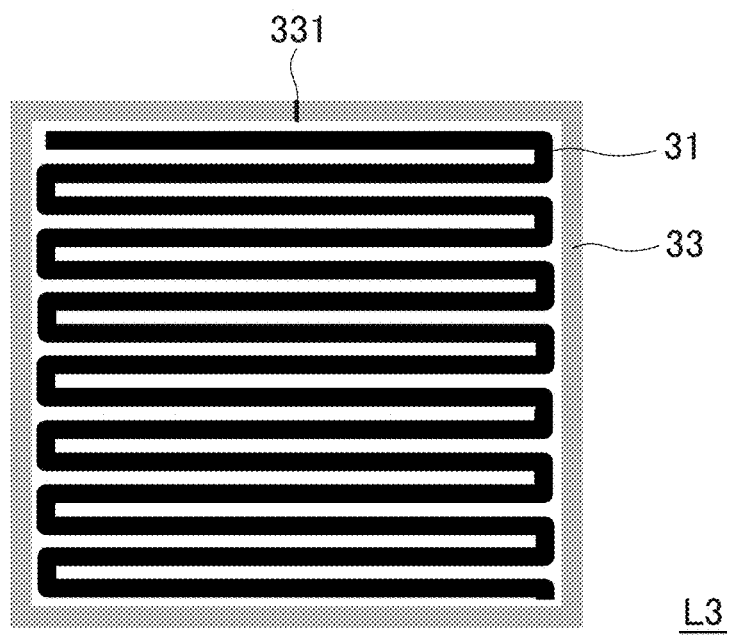
FIG. 1C is a schematic view illustrating a third embodiment of a multi-layer body.

FIG. 1C illustrates a folded-back body L3 as one embodiment of the multi-layer body. The folded-back body L3 is an assembly configured such that a long carbon-based sheet material 31 (black-colored area) is folded back on itself with a constant width in a non-bonded state. The outer circumference of the folded-back carbon-based sheet material 31 is surrounded by a metal-based sheet material 33 to have a rectangular shape. In addition, both end portions of the metal-based sheet material 33 that extend in the longitudinal direction (perpendicular direction to the plane of paper) are bonded such as by laser welding to form a combined portion 331 (holding portion).

For descriptive purposes, FIG. 1C depicts air gaps (white areas) between adjacent parts of the folded-back carbon-based sheet material 31. Such air gaps may be, or may not be, provided depending on the specifications required for the thermal conductive stress relaxation structure. For example, when the heat-transfer quantity per unit volume should be increased, it may be preferred that the parts of the carbon-based sheet material 31 are in a non-bonded and close contact state with one another. When, on the other hand, the thermal stress relaxation effect should be enhanced, it may be preferred that the parts of the carbon-based sheet material 31 are in a state where they are in a non-bonded and separated state from one another (air gaps are provided). This applies to the embodiments shown in FIG. 1A and FIG. 1B and other embodiments such as shown in FIG. 1D as will be described below.

Figure 1D:
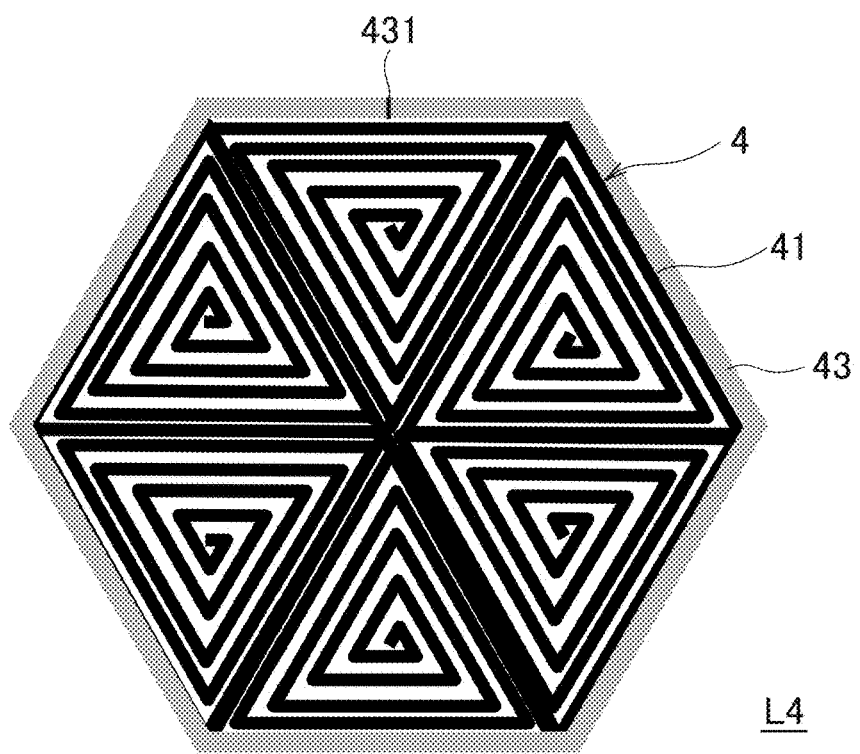
FIG. 1D is a schematic view illustrating a fourth embodiment of a multi-layer body.

FIG. 1D illustrates a set of rolled-up bodies L4 as one embodiment of a set of multi-layer bodies. The set of rolled-up bodies L4 is an assembly configured such that six unit rolled-up bodies 4 are prepared in each of which a long carbon-based sheet material 41 (black-colored area) is rolled up in a non-bonded state to have a substantially regular triangular shape and they are collectively arranged in a non-bonded state and in close contact with one another to have a substantially regular hexagonal shape. The outer circumference thereof is surrounded by a metal-based sheet material 43 to have a regular hexagonal shape. In addition, both end portions of the metal-based sheet material 43 that extend in the longitudinal direction (perpendicular direction to the plane of paper) are bonded such as by laser welding to form a combined portion 431 (holding portion).

Figure 1E:
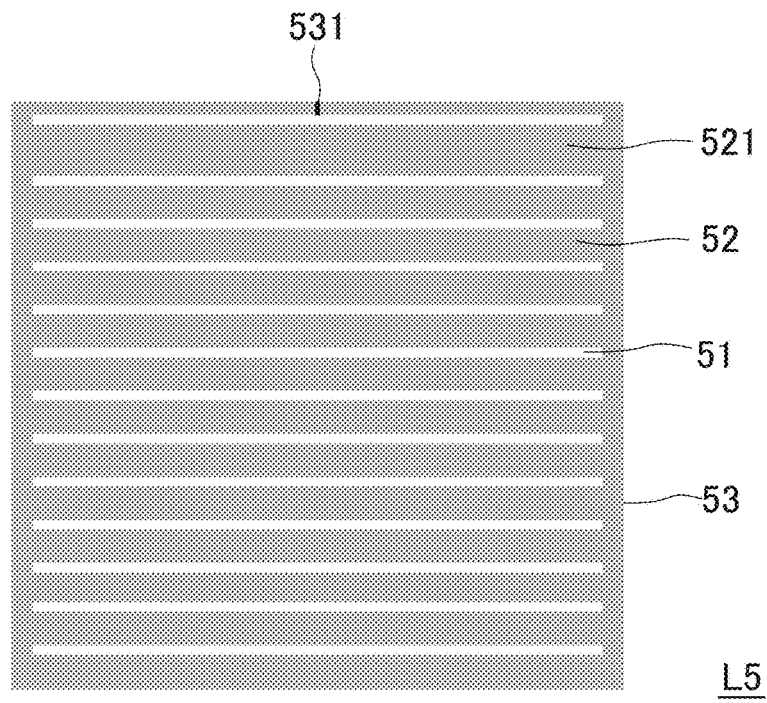
FIG. 1E is a schematic view illustrating a fifth embodiment of a multi-layer body.

FIG. 1E illustrates a stacked body L5 as one embodiment of the multi-layer body. The stacked body L5 is an assembly configured such that metal-based sheet materials 52 (similar to the metal-based sheet materials 22) are stacked in one direction via air gaps 51 having a predetermined width, and the adjacent metal-based sheet materials 52 are in a non-bonded state due to the air gaps 51 therebetween. The outer circumferential side end portions of the metal-based sheet materials 52 are surrounded by a metal-based sheet material 53 that has the same material quality as those of the metal-based sheet materials 52, and both end portions of the metal-based sheet material 53 that extend in the longitudinal direction (perpendicular direction to the plane of paper) are bonded such as by laser welding to form a combined portion 531 (holding portion).

In the stacked body L5, the air gaps 51 are formed between the adjacent metal-based sheet materials 52 which are responsible for the heat transfer, so that the metal-based sheet materials 52 are easy to deform, and the stacked body L5 therefore exhibits high thermal stress relaxation ability. As shown in FIG. 1E, various designs may appropriately be employed, such as that a metal-based sheet material 521 of which the thickness is changed from those of the metal-based sheet materials 52 is provided at a desired region, and the width and distance of the air gaps 51 are altered or adjusted depending on regions.

As described above, such air gaps 51 can easily be formed by alternately stacking organic substance-based materials having a desired thickness and the metal-based sheet materials 52 to form a preliminarily stacked body (preliminary assembly) and performing an appropriate step, such as heating the preliminarily stacked body or immersing the preliminarily stacked body in a solvent, to remove (dissipate) the organic substance-based materials. During this process, one or more laminated sheets in which one or more organic substance-based materials and one or more metal-based materials are preliminarily laminated on one another may be used as substitute for the organic substance-based sheet materials and the metal-based sheet materials. In an alternative embodiment, the dissipating step for the organic substance-based sheet materials or the organic substance-based materials may be a shared step with a heating step (end portion forming step) that performs braze bonding etc. to form the holding portion on the multi-layer body.

Figure 1F:
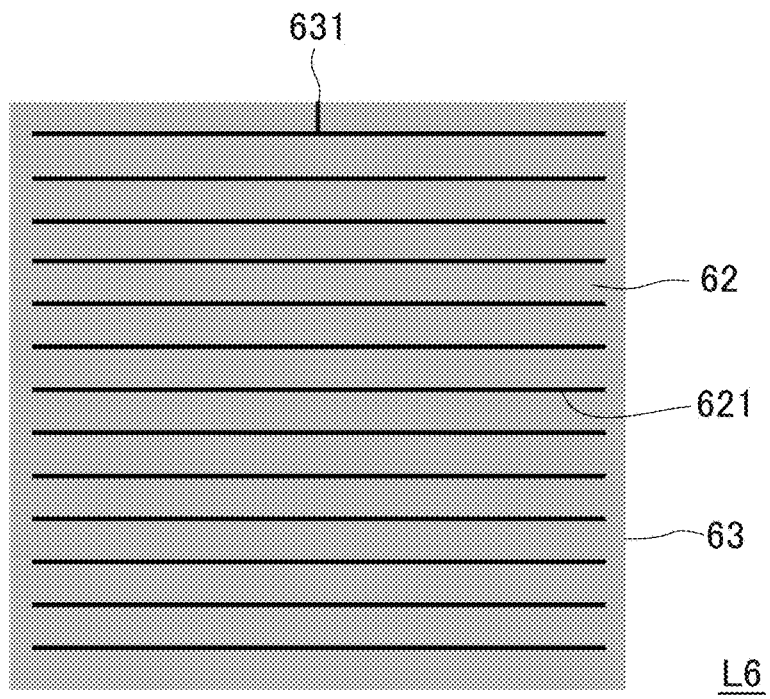
FIG. 1F is a schematic view illustrating a sixth embodiment of a multi-layer body.

FIG. 1F illustrates a stacked body L6 as one embodiment of the multi-layer body. The stacked body L6 comprises an assembly configured such that metal-based sheet materials 62 formed thereon with low frictional coats (low frictional layers) 621 are stacked in one direction. In this case, the metal-based sheet materials 62 are adjacent to one another via the low frictional coats 621 in a non-bonded state. The outer circumferential side end portions of the metal-based sheet materials 62 are surrounded by a metal-based sheet material 63 that has the same material quality as those of the metal-based sheet materials 62, and both end portions of the metal-based sheet material 63 that extend in the longitudinal direction (perpendicular direction to the plane of paper) are bonded such as by laser welding to form a combined portion 631 (holding portion).

Each low frictional coat 621 may be enough if being present between each adjacent two metal-based sheet materials 62, and a single low frictional coat 621 may be formed only on either surface of each metal-based sheet material 62, or low frictional coats 621 may be formed on both surfaces of each metal-based sheet material 62. Examples of the low frictional coats 621 include various diamond-like carbon films (DLC films) or ceramics coatings (e.g., TiN film) formed by surface treatment, such as CVD and PVD, and various plated films (e.g., chromium plated film)

In the stacked body L6, the metal-based sheet materials 62, which are responsible for the heat transfer, slide via the low frictional coats 621 at adjacent interfaces so that deformable regions are divided, and the stacked body L6 has thus enhanced thermal stress relaxation ability. Therefore, the thermal conductive sheet materials that constitute the multi-layer body according to the present invention may comprise a combination of different type materials (e.g., carbon-based sheet material and metal-based sheet material), such as in the rolled-up body L1 and the stacked body L2, in which case the friction coefficient at the time of contact is more easily reduced than the case of the same type materials, but may comprise the same type materials (one type of thermal conductive sheet materials), provided that the air gaps and/or the low frictional layers are present, such as in the stacked bodies L5 and L6.

Figure 1G:
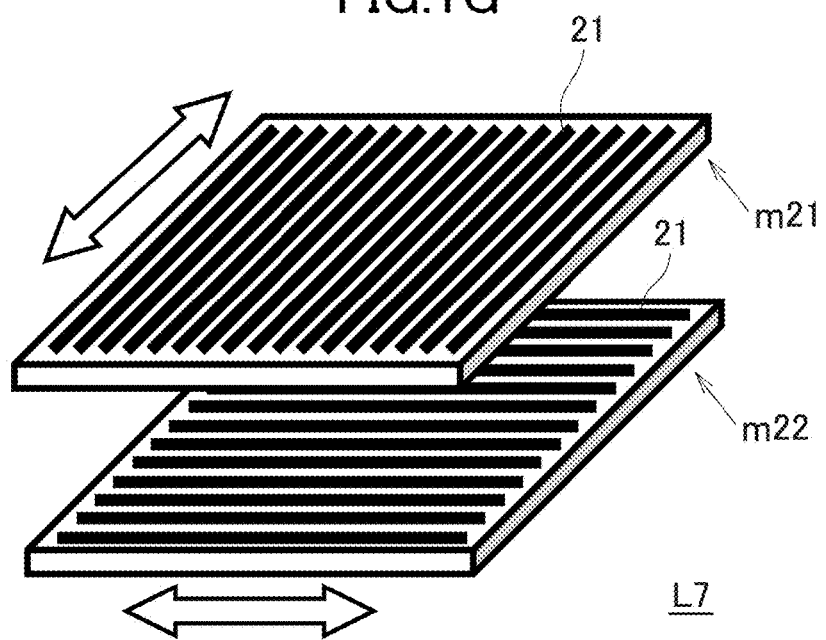
FIG. 1G is a schematic view illustrating a seventh embodiment of a multi-layer body.

FIG. 1G illustrates a case where board-like (plate-like) multi-layer body m21 and multi-layer body m22 that are cut out with a predetermined thickness from the above-described column-like stacked body L2 are united so that the extending directions of the carbon-based sheet materials 21 intersect with each other, and a united multi-layer body L7 is thus obtained. The united multi-layer body L7 is configured such that enhanced thermal diffusion is achieved in each of the extending directions of the carbon-based sheet materials 21 in the multi-layer bodies m21 and m22 (arrows shown in FIG. 1G), and exhibits enhanced three-dimensional thermal conductivity.

Figure 1H:
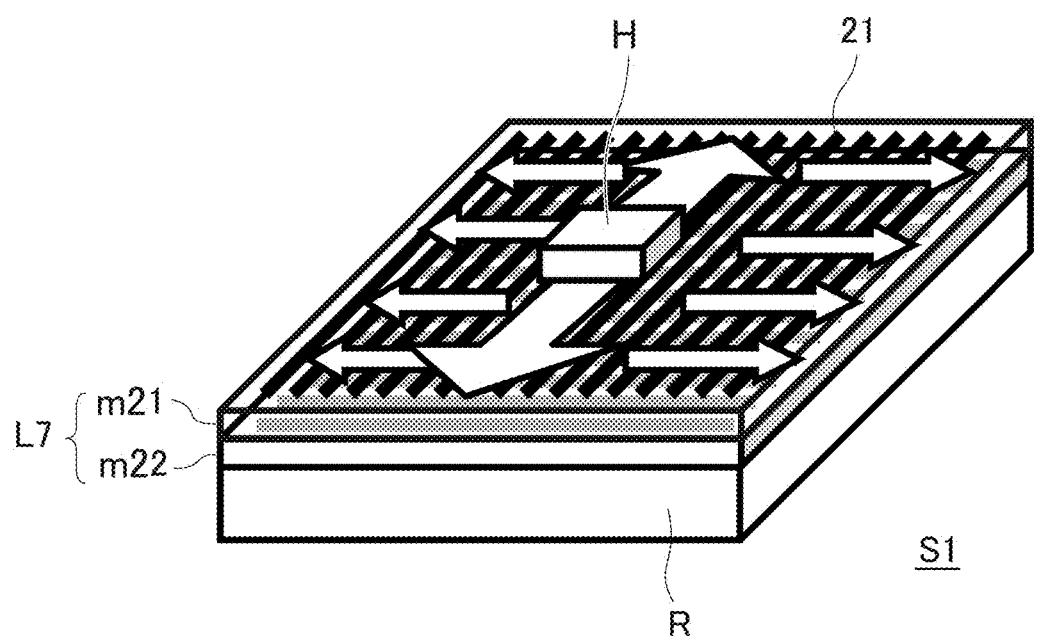
FIG. 1H is a schematic view illustrating a structure in which the multi-layer body according to the seventh embodiment is interposed between a high-temperature substance and a low-temperature substance.

In such a manner, the multi-layer bodies m21 and m22 may be united so that the extending directions of the carbon-based sheet materials 21 intersect with each other, thereby to achieve enhanced thermal conductivities in three dimensions. In addition, the extending directions of the thermal conductive sheet materials 21 intersect with each other, so that uniform thermal stress characteristics are exhibited in in-plane directions, and the thermal stresses can be relaxed in the united multi-layer body L7 and therefore in the whole of the thermal conductive stress relaxation structure. While FIG. 1G illustrates a case where two multi-layer bodies are united to be orthogonal to each other, features such as the intersecting direction and the number of bodies to be united may appropriately be adjusted. In an alternative embodiment, the multi-layer body m21 and the multi-layer body m22 may be cut out from the column-like folded-back body L3 or other multi-layer bodies. A structure S1, as one embodiment in which the united multi-layer body L7 is interposed between a high-temperature substance H and a low-temperature substance R, is shown in FIG. 1H.

The structure S1 is configured such that the high-temperature substance H is disposed on the side of the multi-layer body m21 while the low-temperature substance R is disposed on the side of the multi-layer body m22. In this case, the heat generated in the high-temperature substance H is dissipated into the low-temperature substance R via the united multi-layer body L7. More specifically, the heat generated in the high-temperature substance H is thermally diffused in an enhanced manner in the extending directions of the thermal conductive sheet materials 21 that constitute the multi-layer body m21 (directions shown by large arrows in the figure), and is further thermally diffused in an enhanced manner, via the thermal conductive sheet materials 21 of the multi-layer body m22 in contact with the multi-layer body m21, in the extending directions of the thermal conductive sheet materials 21 of the multi-layer body m22 (orthogonal directions to the extending directions of the thermal conductive sheet materials 21 of the multi-layer body m21, i.e., directions shown by small arrows in the figure). The heat is then entirely transferred from the multi-layer body m22 to the low-temperature substance R to be dissipated. Note that the regions, in the multi-layer body m21, at both sides of each region which is projected from just beneath the high-temperature substance H in the extending direction of the thermal conductive sheet materials 21 (each region to which the heat is thermally diffused in an enhanced manner as shown by each large arrow in the figure) can function as thermal masses that receive the heat quantity diffused in the extending directions of the thermal conductive sheet materials 21 of the multi-layer body m22. Note also that the thermal stress relaxation ability of the united multi-layer body L7 may be an arithmetic average of characteristics between the thermal stress relaxation ability of the multi-layer body m21 and that of the multi-layer body m22.

Figure 1I:
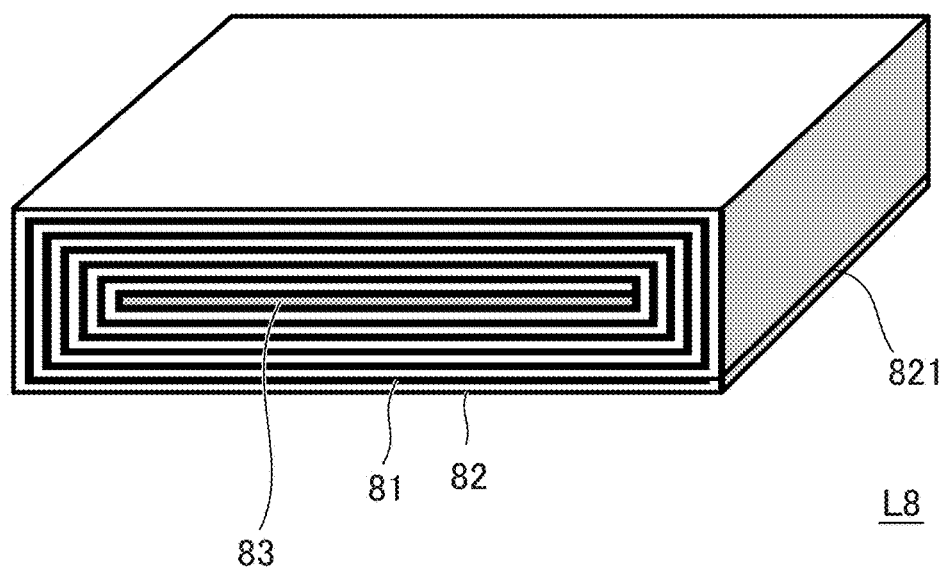
FIG. 1I is a schematic view illustrating an eighth embodiment of a multi-layer body.

FIG. 1I illustrates a rolled-up body L8 as a modified embodiment of the rolled-up body L1. The rolled-up body L8 is an assembly configured such that a carbon-based sheet material 81 (black-colored area) and a metal-based sheet material 82 (white-colored area) are rolled up around a plate-like core material 83 in a non-bonded state to have a plate-like shape. The extending end portion of the metal-based sheet material 82 forms a combined portion 821 (holding portion) bonded such as by laser welding. In the case of this rolled-up body L8, the (thin) plate-like shape causes the thermal conductivity and the deformation due to thermal expansion to be suppressed in the plate surface direction (plate thickness direction). This allows the temperature distribution in the plate plane to be uniform, so that the thermal load and the deformation (such as warpage) can be reduced.

In such a manner, the rolled-up body according to the present invention may have a core material having an outer periphery around which one or more thermal conductive sheet materials are rolled up. This core material may be in an appropriate shape, such as plate-like shape (rectangular column shape) as described above, column-like shape (e.g., solid cylindrical shape), or tubular shape (e.g., hollow cylindrical shape).

Figure 1J:
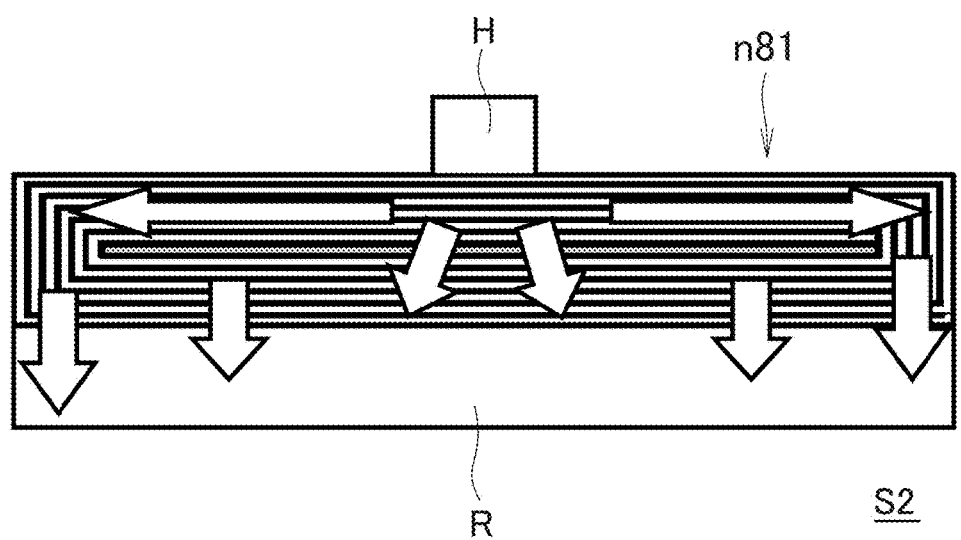
FIG. 1J is a schematic view illustrating a structure in which the multi-layer body according to the eighth embodiment is interposed between a high-temperature substance and a low-temperature substance.

FIG. 1J schematically illustrates by arrows the heat flows in a structure S2 configured such that a board-like rolled-up body n81, which is obtained by cutting the long plate-like rolled-up body L8 with a predetermined thickness, is interposed between a high-temperature substance H and a low-temperature substance R. Note that the bonded surface to the high-temperature substance H shown in FIG. 1J corresponds to the upper surface of the rolled-up body L8 shown in FIG. 1I, and the bonded surface to the low-temperature substance R shown in FIG. 1J corresponds to the lower surface of the rolled-up body L8 shown in FIG. 1I.

Figure 1K:
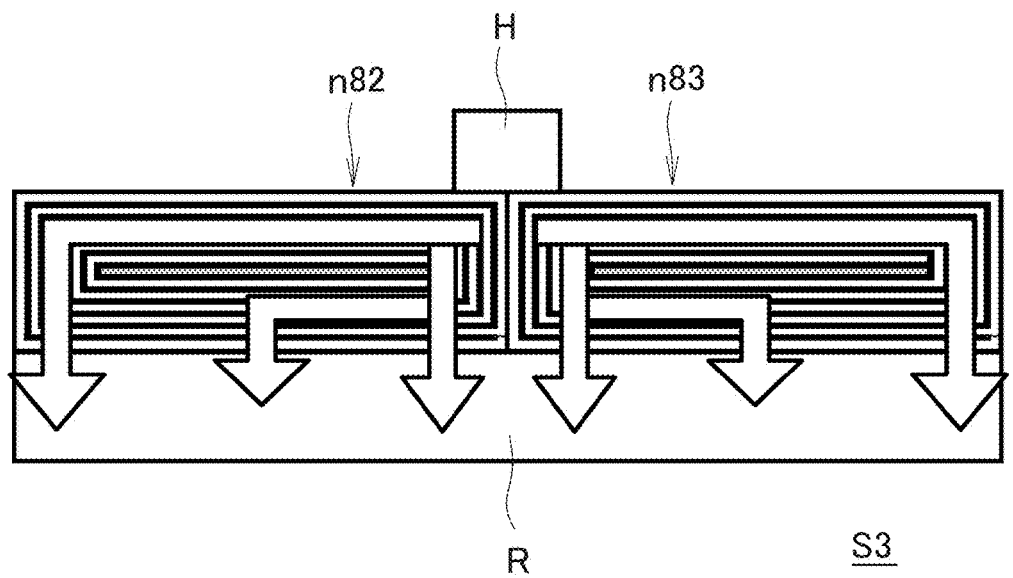
FIG. 1K is a schematic view illustrating a structure in which parallelly arranged multi-layer bodies according to the eighth embodiment are interposed between a high-temperature substance and a low-temperature substance.

FIG. 1K also schematically illustrates by arrows the heat flows in a structure S3 configured such that a set of board-like rolled-up bodies, which is obtained by locating rolled-up bodies n82 and n83 like the rolled-up body 81 to be adjacent to each other, is interposed between a high-temperature substance H and a low-temperature substance R.

In any of these cases, the heat generated in the high-temperature substance H diffuses into the whole of the rolled-up body n81 or the rolled-up bodies n82 and n83 to be dissipated into a widespread region in the low-temperature substance R. When the assembly (multi-layer body) according to the present invention is used in such a way, the heat from the high-temperature substance diffuses into a widespread region and efficiently transferred to the low-temperature substance, so that the temperature distribution caused in the assembly becomes small, and the thermal stress is also relaxed at the bonded interface with the high-temperature substance.

Figure 1L:
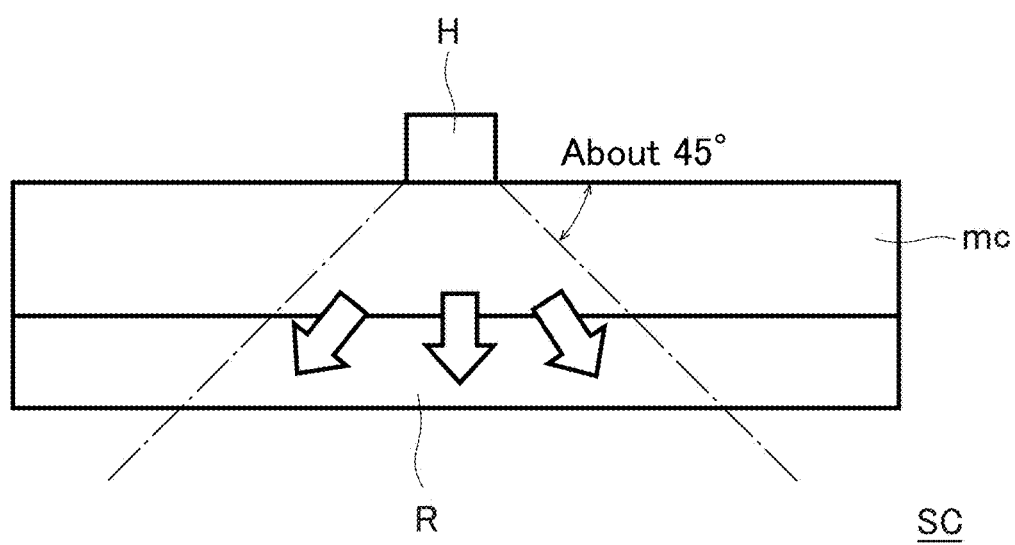
FIG. 1L is a schematic view illustrating a structure in which a conventional heat spreader is interposed between a high-temperature substance and a low-temperature substance.

In contrast, as shown in FIG. 1L, according to a structure SC configured such that a conventional heat spreader mc is interposed between a high-temperature substance H and a low-temperature substance R, the heat from the high-temperature substance H is transferred toward the low-temperature substance R with an angle of about 45 degrees, as shown by arrows. This causes the temperature distribution in the heat spreader mc to significantly vary along from the high-temperature substance H to the low-temperature substance R, so that a large thermal stress due to the deformation (such as warpage) of the heat spreader mc is likely to act on the bonded interface.

Figure 1M:
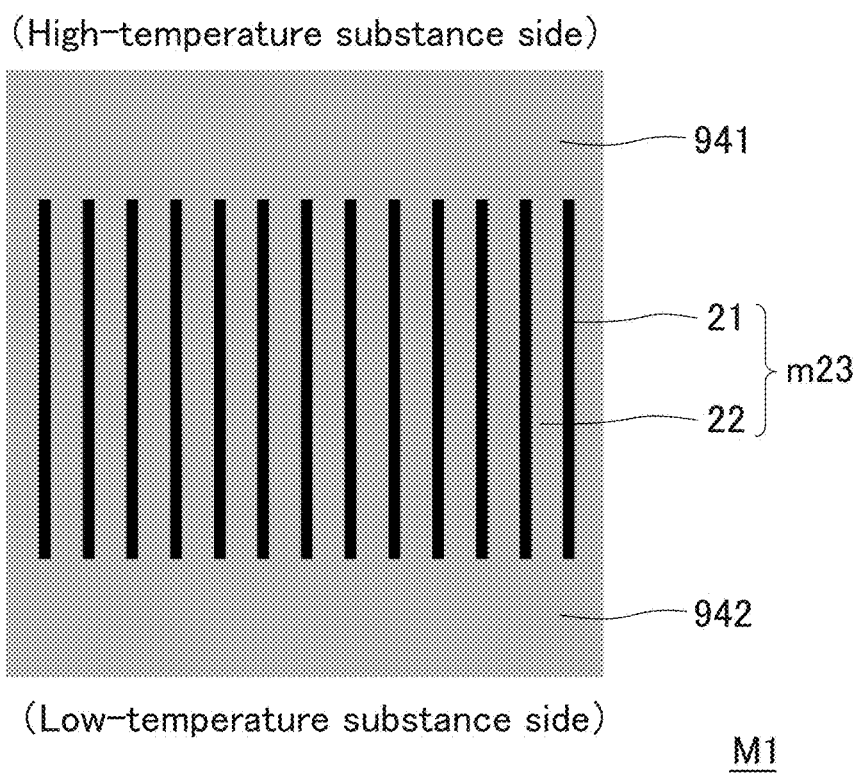
FIG. 1M is a schematic view illustrating a bonded body configured such that holding portions are provided on cut surface portions of a piece obtained by cutting the multi-layer body according to the second embodiment.

FIG. 1M illustrates a bonded body M1 as a type of the structure according to the present invention. The bonded body M1 is configured such that, when a multi-layer body m23 is obtained by cutting the stacked body L2 with a predetermined thickness (width) to have two cut surface portions, holding end portions 941 and 942 each composed of metal are formed respectively on the upper end portion as one cut surface portion (end portion at the high-temperature substance side/upper side in the normal direction to the plane of paper of FIG. 1B) and on the lower end portion as the other cut surface portion (end portion at the low-temperature substance side/lower side in the normal direction to the plane of paper of FIG. 1B). The holding end portions 941 and 942 are formed by performing braze bonding etc. of thin metal plates (metal foils) onto the upper and lower end surfaces of the multi-layer body m23, for example. The holding end portions 941 and 942 are bonded to each metal-based sheet material 22, but are not bonded to each carbon-based sheet material 21, i.e., in a non-bonded state. Therefore, even when the holding end portions 941 and 942 are provided in the bonded body M1, the thermal stress relaxation ability is sufficiently ensured. Moreover, the carbon-based sheet materials 21 are in a close contact state with the holding end portions 941 and 942 at the upper and lower end portions of the multi-layer body m23 bonded strongly to the holding end portions 941 and 942 by way of the metal-based sheet materials 22, so that the heat transfer via the carbon-based sheet materials 21 is also sufficient. In such a way, the heat generated at the high-temperature substance side is dissipated to the low-temperature substance side via the carbon-based sheet materials 21 in close contact with the holding end portions 941 and 942 in a non-bonded state and via the metal-based sheet materials 22 in a bonded state with the holding end portions 941 and 942, while the thermal stresses are relaxed.

It is thus preferred that the assembly according to the present invention has a holding end portion that holds, in a bonded state, at least a part of the thermal conductive material located on an end portion at the high-temperature substance side or the low-temperature substance side. In this case, it is preferred that the thermal conductive material comprises one or more metal-based thermal conductive materials and one or more carbon-based thermal conductive materials, the holding end portion comprises a metal, an end portion or end portions of the one or more metal-based thermal conductive materials are in the bonded state with the holding end portion, and an end portion or end portions of the one or more carbon-based thermal conductive materials are in a non-bonded and close contact state with the holding end portion.

The assembly according to the present invention may be a bundled body configured such that thermal conductive wire materials are bundled to extend in the heat-transfer direction, other than those comprising one or more thermal conductive sheet materials as described above. It is preferred that the thermal conductive wire materials comprise carbon fibers (such as pitch-based and PAN-based), wires formed of various metals as described above, or combination of two or more types thereof, etc.

Provided that the holding portion according to the present invention can hold the gathering state of the thermal conductive sheet materials or the thermal conductive wire materials to make the assembly stand alone, the form thereof is not limited. For example, the holding portion may be configured of a circular frame body (such as a pipe), a housing (such as a case), a band body (such as a band) or other appropriate means, other than the holding portion as described above.

« Use Application »

While the use application is not limited, the thermal conductive stress relaxation structure according to the present invention may preferably be provided between an insulating substrate and a cooler in a power module. Other than this, the thermal conductive stress relaxation structure according to the present invention may be used as a part or whole of a heat spreader or a heat sink for heat generating devices, such as CPUs in a power module or an electronic device and an LED illumination.

EXAMPLES

<Assembly>
« Production of Sample »

A sample (rolled-up body) as one example of the assembly according to the present invention was produced as below. First, an aluminum foil having a size of width 60 mm×thickness 20 micrometers (available from Nippon Foil Mfg. Co., Ltd.) and a graphite sheet having a size of width 60 mm×thickness 40 micrometers (available from KANEKA CORPORATION) were alternately and densely rolled up on an aluminum core rod (diameter: 4 mm/core material) to have a diameter of 20 mm or 38 mm using a rolling-up machine. Thereafter, the terminating portion of the aluminum foil was combined in the width direction (longitudinal direction of rod) by means of laser welding.

A rolled-up body (sample) was thus obtained to comprise an aluminum-based sheet material (the aluminum foil) and a carbon-based sheet material (the graphite sheet) and have a holding portion, at the terminating portion, for holding the gather state thereof.

« Observation »

Figure 2A:
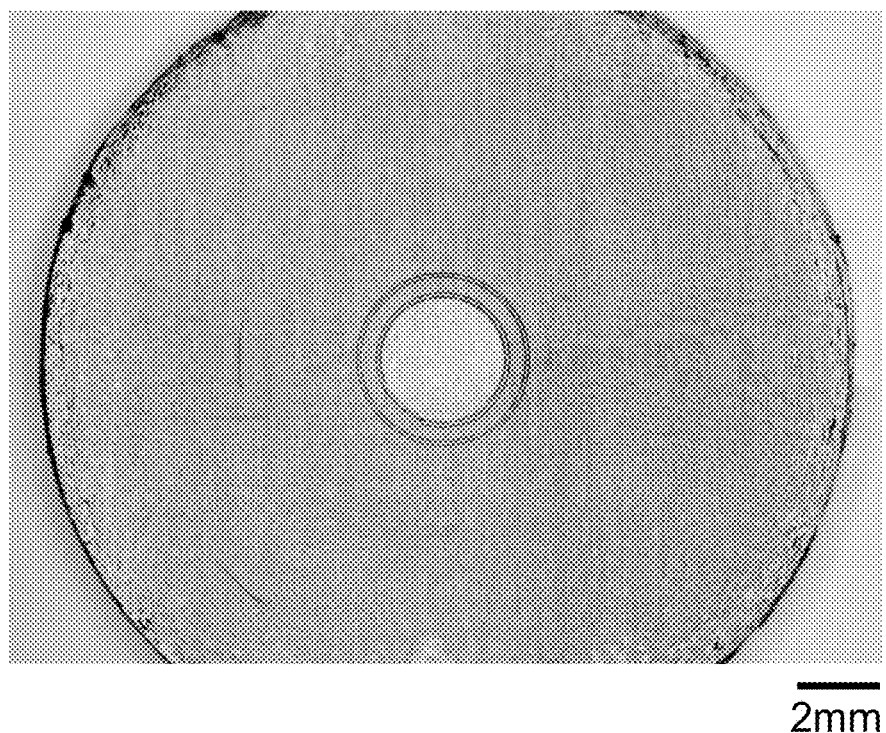
FIG. 2A is a photograph showing one example of an assembly.
Figure 2B:
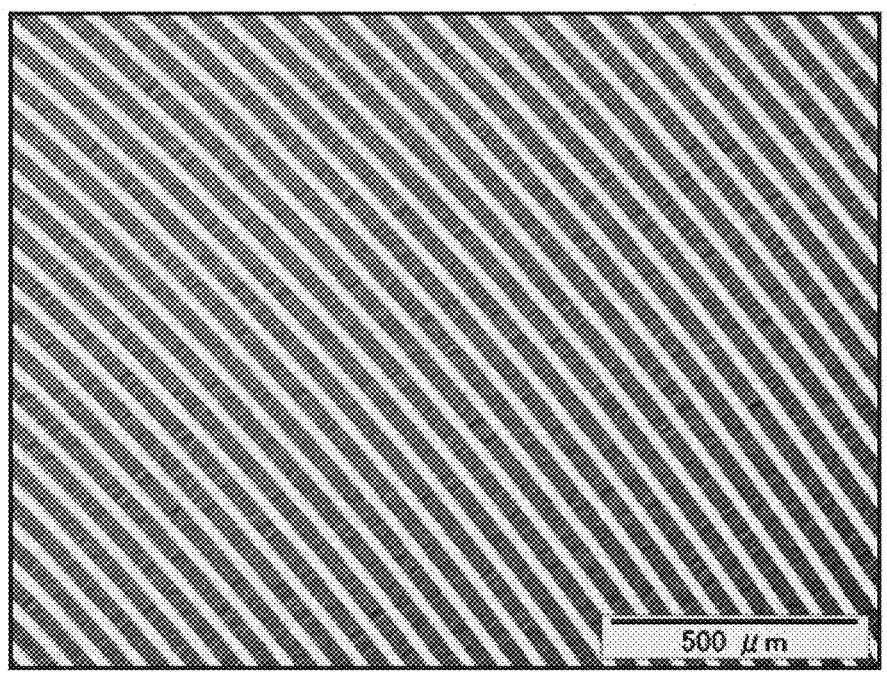
FIG. 2B is a magnified photograph thereof.

FIG. 2A is a photograph obtained by observing a cross-sectional surface of a test piece that was cut with a predetermined length (thickness) from the obtained sample having a size of diameter 20 mm×60 mm, and FIG. 2B is a magnified photograph of a part thereof. Black-colored parts in the photographs represent the graphite sheet, while gray-colored parts represent the aluminum foil.

« Measurement »

(1) Thermal Conductivity

Three types of test pieces were prepared to have respective lengths of 17 mm, 28 mm and 47 mm by cutting two samples, produced in the above manner, each having a size of diameter 20 mm×60 mm. The thermal conductivities of these test pieces were measured in the heat-transfer direction, i.e., the normal direction of the cross-sectional surface (extending direction of each sheet), using the steady-state method. Specifically, the thermal resistance at the interface was calculated in the heat-transfer direction under the steady heat flow, and the thermal conductivity of each test piece was obtained by subtracting the amount of the thermal resistance. The average value of the thermal conductivities obtained in such a manner was 837 W/mK, and the thermal conductivity was excellent.

(2) Slidability

The aluminum foil (Al sheet) and the graphite sheet (Gr sheet) used in the production of sample were used to measure the friction coefficient between each respective sheets by the ring-on-plate test (surface pressure: 0.1 MPa).

The friction coefficient when the Al sheets were slid on each other was 0.72, but the friction coefficient when the Al sheet and the Gr sheet were slid on each other was 0.09, and it was found that the slidability was drastically improved. It was also found from the above that at least one of the multi-layer sheet materials being the Gr sheet was able to enhance the thermal stress relaxation ability of the thermal conductive stress relaxation structure, rather than both of the multi-layer sheet materials being Al sheets.

<Bonded Body>

« Production of Test Piece »

A test piece (board-like rolled-up body) having a thickness of 2 mm was cut out from the sample (rolled-up body) produced as described above and having a size of diameter 38 mm×60 mm, and both cut surfaces thereof were polished using a polishing paper of #600. Thereafter, a DBA (Direct Brazed Aluminum) substrate (available from Mitsubishi Materials Corporation) having a size of 24 mm×24 mm×thickness 1.5 mm and an Al alloy plate (JIS A3003) having a size of 24 mm×24 mm×thickness 9 mm were concurrently bonded by brazing to the upper surface and the lower surface, respectively, of the test piece while being center aligned. The braze bonding was performed by interposing an Al brazing foil (JIS BA4004) at each interface therebetween and heating in vacuum. During this operation, the DBA substrate, the test piece and the Al alloy plate were heated at 600 degrees C. (brazing temperature) while being pressurized at 0.2 MPa (bonding pressure). After the braze bonding, protruding parts of the test piece from the DBA substrate and the Al alloy plate were cut away, and a bonded body (thermal conductive stress relaxation structure) in whole was thus obtained to have a size of 24 mm×24 mm×thickness 12.5 mm.

Note that the DBA substrate is a laminated substrate in which both the upper and lower surfaces of aluminum nitride (AlN) are metalized using pure Al, and in usual case a semiconductor device (power device) or the like as the heat generating body (high-temperature body) is to be placed on this substrate.

« Observation »

Figure 3A:
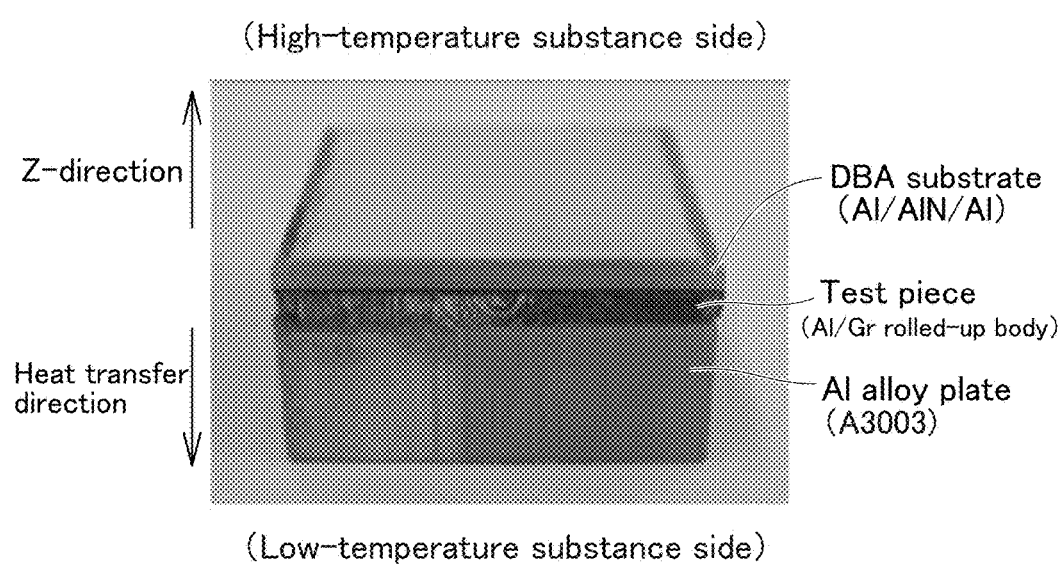
FIG. 3A is a photograph showing one example of a bonded body using the assembly.

(1) FIG. 3A shows a photograph of the appearance of the obtained bonded body. FIG. 3B is a magnified photograph of a cross-sectional surface of the bonded body. As found from FIG. 3B, the test piece (rolled-up body) after the braze bonding is in a state of having already been deformed. This is because the test piece has been deformed to absorb the difference in contraction amount caused between the Al alloy plate having a higher coefficient of thermal expansion and the DBA substrate having a lower coefficient of thermal expansion during the cooling stage in the braze bonding step. This deformation of the test piece significantly relaxes the thermal stress that would be generated between the DBA substrate and the Al alloy plate during the braze bonding, and a bonded body can thus be obtained to have less residual stress.

Figure 3C:
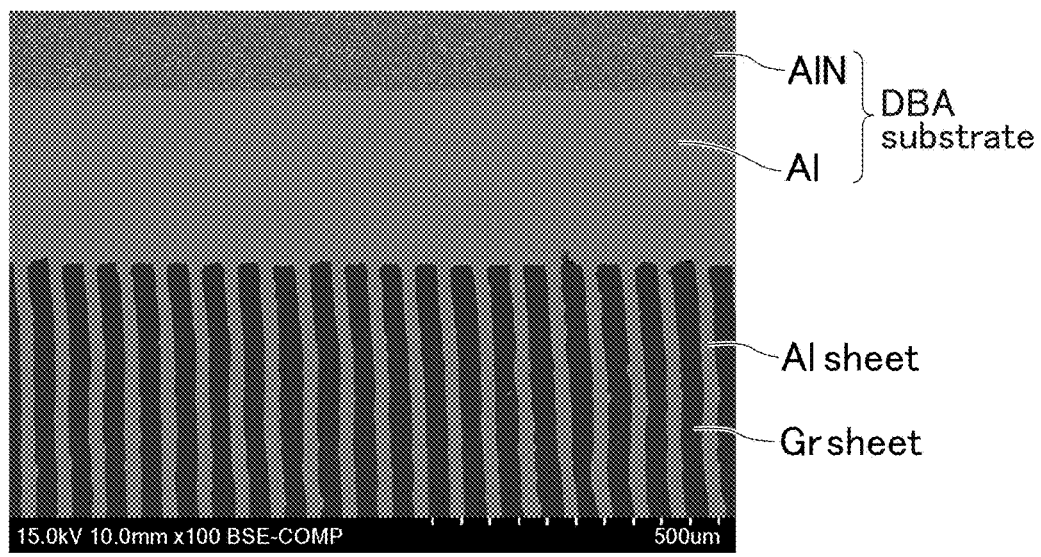
FIG. 3C shows SEM (BSE) photographs when the vicinities of bonded interfaces were observed on the cross-sectional surface.
Figure 3C:
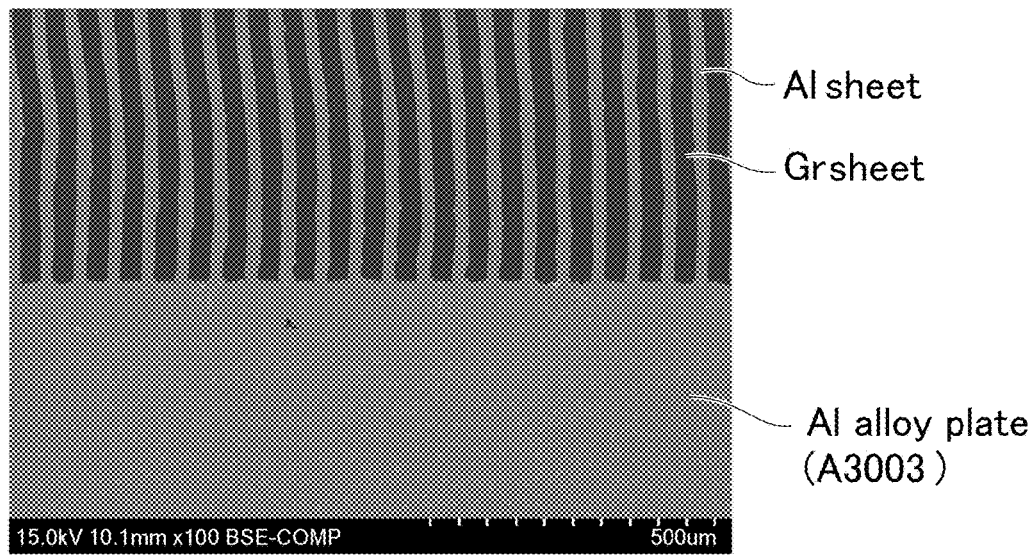

(2) FIG. 3C shows back scattered electron (BSE) images obtained by observing the cross-sectional area of the bonded body using a scanning electron microscope (SEM). The upper photograph in the figure is a BSE image when the vicinity of the bonded interface at the DBA substrate side was observed, while the lower photograph in the figure is a BSE image when the vicinity of the bonded interface at the Al alloy plate side was observed. As found from FIG. 3C, Al sheets that constitute the test piece (rolled-up body) are metallically bonded, at their upper and lower end surfaces, to the Al layer of the DBA substrate and the Al alloy plate, respectively, by way of braze bonding thereby to be integrated with the Al layer and the Al alloy plate. In contrast, the Gr sheets were in a non-bonded state with any of the Al sheets, the Al layer of the DBA substrate, and the Al alloy plate. Note, however, that the Gr sheets were in a close contact state with them without generating any chemical compound and air gap, etc.

« Measurement of Coefficient of Thermal Expansion »

A test piece having a thickness of 2 mm as described above was prepared separately. The coefficient of thermal expansion in the cross-sectional radial direction was measured using the image correlation method. Specifically, the test piece to which markers for image correlation analysis were applied was heated from 25 degrees C. to 180 degrees C. on a hotplate, and the appearance during this operation was imaged. The image at 25 degrees C. was used as the basis to measure the distribution of thermal expansion strain in the test piece. The heating temperature was measured using a thermocouple attached to the test piece. As a result of calculation based on the temperature dependency, obtained in such a manner, of the thermal expansion strain of the test piece, the coefficient of thermal expansion of the test piece was 13 ppm/K within the temperature range (25-180 degrees C.). This coefficient of thermal expansion is a lower value than those of aluminum and copper which are used for coolers, and it has been found that the test piece is preferable for a thermal stress relaxation member.

« Cooling/Heating Cyclic Test »

Figure 4:
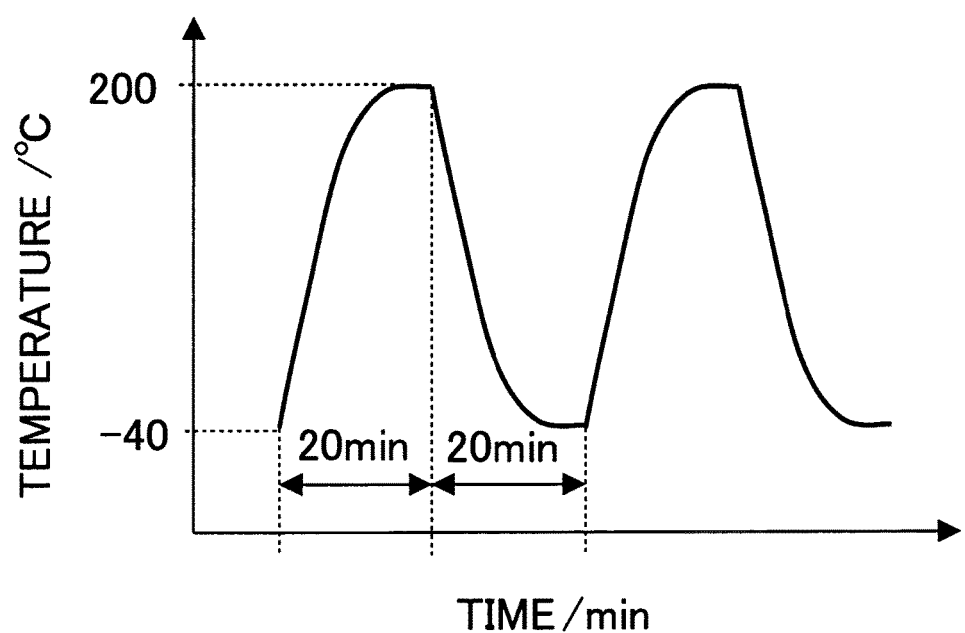
FIG. 4 is an explanatory chart illustrating a temperature history during a cooling/heating cycle test for a bonded body.

There were prepared a bonded body obtained by bonding the above-described test piece to other components (referred simply to as Example) and a bonded body obtained by bonding a pure Al plate (JIS A1050) as substitute for the test piece to other components (referred simply to as Comparative Example). These bonded bodies were placed on the shelf of a cooling/heating shock tester (TSV-40ht available from ESPEC Corp. (formerly TABAI ESPEC Corp)), and a gas phase cooling/heating cycle test was performed to repeat heating and cooling. This test was conducted such that, as shown in FIG. 4 illustrating a temperature history, rise and fall in temperature were repeated every 20 minutes between minus 40 degrees C. and plus 200 degrees C. in atmospheric air. After repeating this cooling/heating cycle 100 times, each bonded body was put out to be subjected to measurement of the shape and strain of the bonded body and the residual stress in the AlN of the DBA substrate. Thereafter, for each bonded body, changes were compared between before and after the cooling/heating cycle test.

(1) Shape of Bonded Body

For each bonded body before and after the cooling/heating cyclic test, the change in Z-direction height (profile change) was measured using the image correlation method along a diagonal line on the uppermost surface of the DBA substrate (the Al layer located at the opposite side to the bonded interface). Note that the Z-direction is as shown in FIG. 3A.

Profiles at the uppermost surface of each bonded body are shown in FIG. 5A (Example) and FIG. 5B (Comparative Example), where Z=0 at both ends of the diagonal line (corners of the uppermost surface). As found from FIG. 5A, the Example was such that the maximum deflection amount before the test (after braze bonding) was about 13 micrometers, and the Z-direction height after the test was almost unchanged from that before the test. In contrast, as found from FIG. 5B, the Comparative Example was such that the maximum deflection amount before the test (after braze bonding) was about 25 micrometers, and the Z-direction height significantly changed after the test to result in large undulation on the uppermost surface. From the above, it has been found that the maximum deflection amount before the test (after braze bonding) in the Example is about half that in the Comparative Example, and the change in the Z-direction height before and after the test in the Example is also small.

(2) Strain in Bonded Body

For each bonded body after the 100-cycle cooling/heating cycle test, the maximum principal strain at 150 degrees C. of the above-described uppermost surface was measured using the image correlation method with reference to that at room temperature. Results were such that the maximum principal strain in the Comparative Example was 0.0011 while that in Example was 0.0007. From the above, it has been found that the strain after the cooling/heating cycle test in the Example is reduced by about 40% compared with that in the Comparative Example.

(3) Residual Stress in MN Layer of Bonded Body

The residual stress caused due to the cooling/heating test in the AlN layer of the DBA substrate as a component of each bonded body was measured using X-ray diffraction. For a sample prepared such that the central portion of the Al layer at the uppermost surface side of the DBA substrate was removed with rectangular shape to expose a part of the AlN layer, the measurement was conducted on the basis of the procedure provided by the Standard for X-Ray Stress Measurement (The Society of Materials Science, Japan, JSMS Committee on X-ray Study of Mechanical Behavior of Materials (1997)). Specifically, a horizontal sample stage type strong X-ray diffractometer (RINT-TTR available from Rigaku Corporation) was used to perform the parallel beam method and the iso-inclination method. During this operation, the X-ray source was Cu K-alpha, and the output was 50 kV-300 mA.

On the basis of the X-ray diffraction pattern obtained in such a manner, each residual stress (SIGMA) was calculated using the $\sin^2(\text{PHI})$ method. There were calculated (SIGMA)=−11 MPa for the Example and (SIGMA)=−154 MPa for the Comparative Example after the braze bonding and before the cooling/heating cycle test. There were also calculated (SIGMA)=−2 MPa for the Example and (SIGMA)=−338 MPa for the Comparative Example after the 100-cycle cooling/heating cycle test. Note that plus sign "+" means a tensile stress while minus sign "−" means a compressive stress.

The Comparative Example had a high compressive residual stress even before the cooling/heating cycle test (after braze bonding), and the compressive stress increased twice after the test. In contrast, the Example was such that the compressive residual stress acting before and after the test was negligible, i.e., almost zero.

The compressive residual stress acting on the AlN layer causes a tensile stress in the Al layer (uppermost surface), and this tensile stress may deteriorate mechanical properties, such as the bonding strength and bonding life between the Al layer and a semiconductor element or the like provided on the Al layer. Therefore, a bonded body having a significantly large compressive residual stress acting on the AlN layer, like in the Comparative Example, may be difficult to improve the reliability of a structure which may include a sensitive component such as semiconductor element. In contrast, a bonded body having a drastically small compressive residual stress acting on the AlN layer, like in the Example, can enhance the reliability of a structure which may include a sensitive component such as semiconductor element. This is because the assembly (such as rolled-up body and stacked body) located between the high-temperature substance and the low-temperature substance has high thermal conductivity and can sufficiently absorb and relax the thermal stress in whole, which would act at the time of bonding or during the cooling/heating cycle.

REFERENCE SIGNS LIST

L1 . . . Multi-layer body (assembly)
L2 . . . Stacked body
L3 . . . Folded-back body
L4 . . . Set of rolled-up bodies
11, 21, 31, 41 . . . Carbon-based sheet material
12, 22 . . . Metal-based sheet material
23, 33, 43 . . . Metal-based sheet material (surrounding)
121, 231, 331, 431 . . . Combined portion (holding portion)
4 . . . Unit rolled-up body

The invention claimed is:

1. A thermal conductive stress relaxation structure configured to contact thermally conductive substrates including a high-temperature substrate and a low-temperature substrate, the thermal conductive stress relaxation structure configured to: (i) conduct heat in a heat-transfer direction from the high-temperature substrate to the low-temperature substrate, and (ii) relax a thermal stress that can be generated between the high-temperature substrate and the low-temperature substrate, the thermal conductive stress relaxation structure comprises: an assembly configured such that a thermal conductive material gathers in a non-bonded state, and the assembly comprises: a multi-layer body configured such that two or more thermal conductive sheet materials, or two or more parts of one thermal conductive sheet material, overlap one another to extend continuously in the heat-transfer direction, where: (i) the multi-layer body comprises a rolled-up body configured such that one or more thermal conductive sheet materials are rolled up in a non-bonded state around an axis that is perpendicular to planes defined by contact surfaces that are defined by: (a) a contact surface between the thermal conductive stress relaxation structure and the high-temperature substrate, and (b) a contact surface between the thermal conductive stress relaxation structure and the low-temperature substrate, and (ii) a periphery portion of the rolled-up body is exposed such that the periphery portion is not covered by any of the thermally conductive substrates.

2. The thermal conductive stress relaxation structure as recited in claim 1, wherein the thermal conductive material comprises two or more types of materials having different material qualities and characteristics.

3. The thermal conductive stress relaxation structure as recited in claim 1, wherein the rolled-up body further comprises a core material having an outer periphery around which the one or more thermal conductive sheet materials are rolled up.

4. The thermal conductive stress relaxation structure as recited in claim 3, wherein the core material is in a plate-like shape.

5. The thermal conductive stress relaxation structure as recited in claim 1, wherein the two or more thermal conductive sheet materials comprise different type materials such that a friction coefficient at a time of contact is more reduced than a case of same type materials.

6. The thermal conductive stress relaxation structure as recited in claim 1, wherein the two or more thermal conductive sheet materials are such that a metal-based sheet material and a carbon-based sheet material are adjacent to each other in a non-bonded state.

7. The thermal conductive stress relaxation structure as recited in claim 6, wherein the metal-based sheet material comprises an aluminum-based sheet material.

8. The thermal conductive stress relaxation structure as recited in claim 1, wherein the assembly further comprises a bundled body configured such that thermal conductive wire materials are bundled to extend in the heat-transfer direction.

9. The thermal conductive stress relaxation structure as recited in claim 1, wherein at least a part of the thermal conductive material has a low frictional layer at a surface to reduce a friction coefficient between adjacent ones.

10. The thermal conductive stress relaxation structure as recited in claim 1, wherein the assembly is configured such that an air gap is formed between adjacent parts of the thermal conductive material.

11. The thermal conductive stress relaxation structure as recited in claim 1, wherein the assembly has a holding end portion that holds, in a bonded state, at least a part of the thermal conductive material located on an end portion at the high-temperature substrate side or the low-temperature substrate side.

12. The thermal conductive stress relaxation structure as recited in claim 11, wherein
the thermal conductive material comprises one or more metal-based thermal conductive materials and one or more carbon-based thermal conductive materials, the holding end portion comprises a metal,
an end portion or end portions of the one or more metal-based thermal conductive materials are in the bonded state with the holding end portion, and
an end portion or end portions of the one or more carbon-based thermal conductive materials are in a non-bonded and close contact state with the holding end portion.

13. The thermal conductive stress relaxation structure as recited in claim 1, further comprising a holding portion on at least a part of an outer circumference side to hold a gathering state of the thermal conductive material.

14. A method of producing the thermal conductive stress relaxation structure as recited in claim 10, the thermal conductive material comprising at least a metal-based thermal conductive material, the method comprising:
a preliminarily assembling step that obtains a preliminary assembly in which the thermal conductive material and an organic substance-based material are assembled; and
a dissipating step that burns or dissolves the organic substance-based material to be dissipated from the preliminary assembly, wherein the assembly as recited in claim 10 is obtained.

* * * * *